United States Patent
Aoki et al.

(10) Patent No.: US 11,316,552 B2
(45) Date of Patent: Apr. 26, 2022

(54) HIGH FREQUENCY SWITCH AND ANTENNA DEVICE

(71) Applicant: YOKOWO CO., LTD., Tokyo (JP)

(72) Inventors: Yoshio Aoki, Tokyo (JP); Akihiro Nakamura, Tokyo (JP)

(73) Assignee: YOKOWO CO., LTD., Tokyo (JP)

( * ) Notice: Subject to any disclaimer, the term of this patent is extended or adjusted under 35 U.S.C. 154(b) by 0 days.

(21) Appl. No.: 17/042,269

(22) PCT Filed: Dec. 11, 2018

(86) PCT No.: PCT/JP2018/045508
§ 371 (c)(1),
(2) Date: Sep. 28, 2020

(87) PCT Pub. No.: WO2019/207836
PCT Pub. Date: Oct. 31, 2019

(65) Prior Publication Data
US 2021/0058107 A1     Feb. 25, 2021

(30) Foreign Application Priority Data
Apr. 26, 2018   (JP) .............................. JP2018-085811

(51) Int. Cl.
*H04B 1/44*        (2006.01)
*H03H 11/04*      (2006.01)
*H03H 11/28*      (2006.01)

(52) U.S. Cl.
CPC .............. *H04B 1/44* (2013.01); *H03H 11/04* (2013.01); *H03H 11/28* (2013.01)

(58) Field of Classification Search
CPC .......... H04B 1/0458; H04B 1/18; H04B 1/40; H04B 1/401; H04B 17/318; H04B 17/26;
(Continued)

(56) References Cited

U.S. PATENT DOCUMENTS

| | | |
|---|---|---|
| 6,094,088 A | 7/2000 | Yano |
| 7,692,270 B2 | 4/2010 | Subramanyam |
| (Continued) | | |

FOREIGN PATENT DOCUMENTS

| | | |
|---|---|---|
| JP | 09191266 A | 7/1997 |
| JP | 10242826 A | 9/1998 |
| (Continued) | | |

OTHER PUBLICATIONS

International Search Report for corresponding PCT Application No. PCT/JP2018/045508, 4 pages, dated Mar. 5, 2019.

*Primary Examiner* — Ajibola A Akinyemi
(74) *Attorney, Agent, or Firm* — Matthew B. Dernier, Esq.

(57) ABSTRACT

A high-frequency switch includes an input interface configured to receive a high-frequency signal; an output interface configured to output the high-frequency signal to outside; and a reactance switch inserted between the input interface and the output interface. The reactance switch includes a plurality of reactance circuits connected in a cascade arrangement between the input interface and the output interface. Each of the plurality of reactance circuits is configured to form a common passband for the high-frequency signal based on a reactance of a respective predetermined values, and at least one of the reactance circuits is a variable reactance circuit having a reactance which changes in response to a control signal input from the outside so that the passband of the variable reactance circuit changes.

12 Claims, 6 Drawing Sheets

(58) Field of Classification Search
CPC .... H04B 1/0475; H04B 15/00; H04B 1/1027;
H04B 1/109; H04B 1/12; H04B 1/48;
H04B 17/12; H04B 7/26; H04B 1/3838;
H04B 17/102; H04B 17/29; H04B
2001/045; H04B 7/00; H04B 7/0837
USPC ......................................................... 455/78
See application file for complete search history.

(56) References Cited

U.S. PATENT DOCUMENTS

| | | | |
|---|---|---|---|
| 7,907,924 B2* | 3/2011 | Kawasaki | .............. H03H 7/175 |
| | | | 455/252.1 |
| 10,305,532 B1* | 5/2019 | Jantzi | ................... H04B 1/0458 |
| 10,340,874 B2 | 7/2019 | Horita | |
| 2007/0024400 A1 | 2/2007 | Subramanyam | |
| 2017/0302243 A1 | 10/2017 | Horita | |

FOREIGN PATENT DOCUMENTS

| | | |
|---|---|---|
| JP | 1168409 A | 3/1999 |
| JP | 2007509578 A | 4/2007 |
| WO | 2016076093 A1 | 5/2016 |

* cited by examiner

HIGH FREQUENCY SWITCH AND ANTENNA DEVICE

TECHNICAL FIELD

The present invention relates to a high-frequency switch adapted for switching the state of a high-frequency signal in the frequency range greater than or equal to the microwave band, in particular, the submillimeter wave band and the millimeter wave band, and also relates to an antenna device.

BACKGROUND ART

High-frequency switches disclosed in Patent Literature 1 and 2 are known as the ones for use in the millimeter wave band. Typical examples of high-frequency switches include a circuit illustrated in FIG. 8 of Patent Literature 1. A source and a drain are electrically connected or disconnected in accordance with a voltage applied to a gate. The high-frequency switch disclosed in Patent Literature 1 includes transistors each including a drain, a source, a gate, and a back-gate, and the drain and the source are electrically connected or disconnected. A resistor is connected between the back-gate and the ground. With the resistor, a high-frequency current resulting from capacitance between the drain and the back-gate and between the source and the back-gate is attenuated. Therefore, disconnection performance is maintained even in the millimeter wave band. In the high-frequency switch disclosed in Patent Literature 2, the source terminal of a field-effect transistor is grounded, the gate terminal is connected to an input terminal, and the drain terminal is connected to an output matching circuit. By changing the gate bias voltage, the transmission of a high-frequency signal from the source terminal to the drain terminal is turned On or turned Off.

PRIOR ART DOCUMENTS

Patent Literature

Patent Literature 1: Japanese Patent Laid-Open No. 10-242826
Patent Literature 2: Japanese Patent Laid-Open No. 9-191266

SUMMARY OF INVENTION

Problems to Be Solved by the Invention

In the high-frequency switch disclosed in each of Patent Literature 1 and 2, the resistance components of a channel (i.e. a path) through which a high-frequency signal propagates are increased to disconnect the input and the output for the high-frequency signal, or are reduced to connect the input and the output. The high-frequency switch disclosed in each of Patent Literature 1 and 2 can be regarded as a so-called resistive switch. Such a resistive switch inevitably involves insertion loss, and this can result in a decrease in the level of a high-frequency signal passing through the switch. For example, even a resistance of several Ω may lead to a decrease in gain by 2 to 3 dB, and thus has a significant impact to the level of the high-frequency signal.

On the other hand, a switch in which a signal is absorbed by a resistor and the like when the switch is in the Off-state, such as the high-frequency switch disclosed in Patent Literature 1, is called an absorptive switch. The absorptive switch has reflection characteristics that will not change greatly between when the switch is On and when it is Off, and thus is advantageous in that stable operation is provided. However, in the absorptive switch, heat is generated upon absorption of a signal, and this can be a cause of noise generation.

It is a primary object of the present invention to provide a high-frequency switch capable of high-speed operation and having low loss and noise in high-frequency bands, such as not only the microwave band but also the millimeter wave band.

Solution to the Problems

A high-frequency switch according to the present invention includes: an input interface configured to receive a high-frequency signal; an output interface configured to output the high-frequency signal to outside; and a reactance switch inserted between the input interface and the output interface, wherein the reactance switch includes a plurality of reactance circuits connected in a cascade arrangement between the input interface and the output interface, wherein each of the plurality of reactance circuits is configured to form a common passband for the high-frequency signal based on a reactance of a respective predetermined values, and wherein at least one of the reactance circuits is a variable reactance circuit having a reactance which changes in response to a control signal input from the outside so that the passband of the variable reactance circuit changes.

Advantageous Effects of the Invention

In the high-frequency switch of the present invention, the input and output states do not change in accordance with the level (i.e., high or low) of resistance, rather, a switch function is realized by a change in reactance which is not related to resistance components. Thus, a high-frequency switch with a high speed and low loss can be provided even in high-frequency bands, such as the millimeter wave band.

DESCRIPTION OF EMBODIMENTS

Hereinafter, exemplary embodiments in which the present invention is applied to a high-frequency switch for use in the 29 GHz band, and to a device using the switch will be described.

First Embodiment

Figure 1:
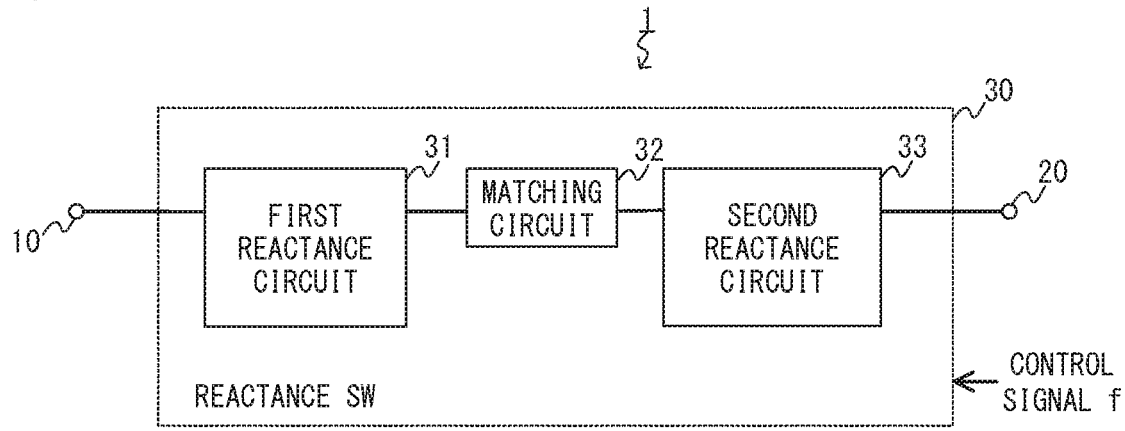
FIG. 1 is a configuration diagram of a high-frequency switch according to a first embodiment.

FIG. 1 is a configuration diagram of a high-frequency switch according to a first embodiment. The high-frequency switch 1 includes an input interface 10, an output interface 20, and a reactance SW (or a reactance switch; hereinafter the same) 30 inserted between them, all of which are formed on, for example, an insulating substrate which is rectangular or substantially rectangular in shape and is less than or equal to about 10 mm square in size.

The input interface 10 is a signal input terminal with a grounding end and a signal end, for example, and receives a high-frequency signal in the 29 GHz band at the signal end. The output interface 20 is a signal output terminal with a grounding end and a signal end, for example. The high-frequency switch 1 forms a first state in which a high-frequency signal input to the input interface 10 is output from the output interface 20, and a second state in which a high-frequency signal input to the input interface 10 is reflected by the reactance SW 30.

The first state and the second state are distinguished from each other in the meaning that the first state represents a state which is different from that represented by the second state. For example, the first state is a state in which a high-frequency signal is guided to the output interface 20 by passing through the reactance SW 30. Meanwhile, the second state is a state in which a high-frequency signal does not reach the output interface 20. This embodiment exemplarily illustrates a case where the first state is used as the On-state and the second state is used as the Off-state for purposes of consistency with the background art.

The reactance SW 30 includes a first reactance circuit 31, a matching circuit 32, and a second reactance circuit 33. Each of the first reactance circuit 31 and the second reactance circuit 33 can be operated as a filter with a variable passband by combining an induction element and a variable capacitance element, for example. The induction element and a wire can be easily implemented by forming conductive patterns, such as distributed constant lines, on the insulating substrate. The variable capacitance element is an element whose reactance changes in accordance with a control signal ("a control signal f") input from the outside. For example, a Schottky diode, a varactor diode, an HEMT (High Electron Mobility Transistor), or an FET (Field effect transistor) can be used for the variable capacitance element. Although an HEMT and an FET are elements operable as active elements, they are operated as passive elements in the first embodiment utilizing their capacitance components. For example, an FET is operated as a variable capacitance element by changing the Schottky capacitance or depletion layer capacitance between the gate and the (source+drain) using a control signal f.

The matching circuit 32 is a circuit which adjusts the reactance between the first reactance circuit 31 and the second reactance circuit 33. The "matching circuit 32" as referred to herein is a circuit for, provided that impedance is represented by $Z=R+jX$, bringing X closer to $X=0$. The matching circuit 32 can be configured with only a conductive pattern. Alternatively, the matching circuit 32 can be omitted if the adjustment of the reactance between the first reactance circuit 31 and the second reactance circuit 33 is not necessary.

In this embodiment, the first reactance circuit 31 is adapted to pass signals in a first frequency band ($f_1$ to $f_2$). Meanwhile, the second reactance circuit 33 is adapted to selectively pass signals in one of a second frequency band ($f_3$ to $f_4$) and a third frequency band ($f_5$ to $f_6$). In a preferred embodiment, when the switch is in the On-state, the impedance of the second reactance circuit 33 as a port element is located at the left end (i.e., resistance components of 0Ω) of the straight line along the abscissa axis of the Smith chart. Meanwhile, when the switch is in the Off-state, the circuit constant of the second reactance circuit 33 is determined so that the impedance is located closer to the right end (i.e., infinite resistance components) of the straight line along the abscissa axis of the Smith chart. Provided that the range of fluctuation of high-frequency signals input to the input interface 10 is a desired frequency band ($f_L$ to $f_H$), each frequency has the following relationship:

$$f_1 < f_3 < f_L \ldots f_H < f_4 < f_2$$

That is, each frequency band has the relationship: the desired frequency band<the second frequency band, the third frequency band<the first frequency band.

Next, the switch function of the high-frequency switch 1 will be described. The switch function is controlled with a control signal f. The control signal f is input from an electronic device connected to the input interface 10 or the output interface 20 at a predetermined timing.

Control interfaces other than the input interface 10 and the output interface 20 may also be provided.

Figure 2:
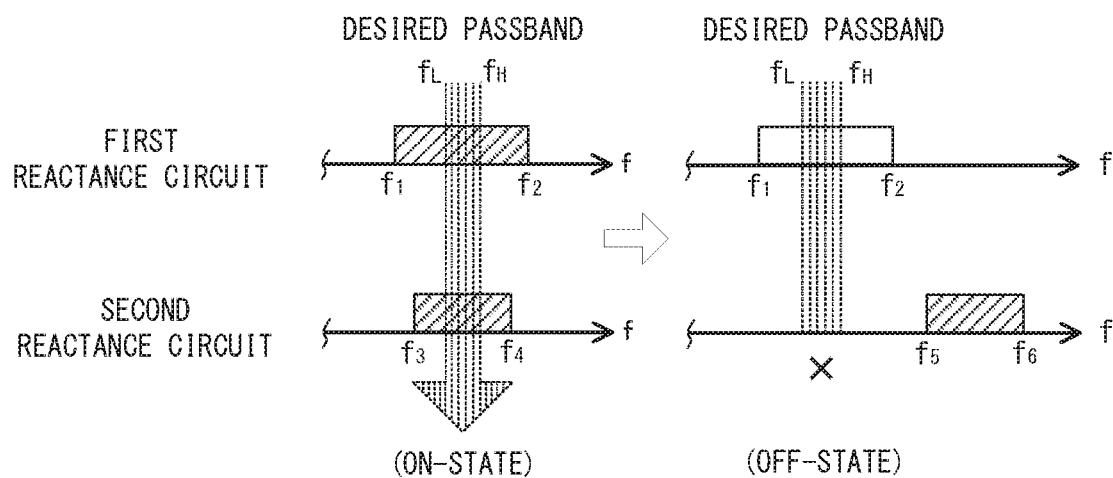
FIG. 2 is a view illustrating the concept of a switch function.

FIG. 2 is a view illustrating the concept of a switch function. The left view of FIG. 2 illustrates a state in which the desired frequency band ($f_L$ to $f_H$) is within each of the first frequency band ($f_1$ to $f_2$) and the second frequency band ($f_3$ to $f_4$). In such a state, a high-frequency signal input to the input interface 10 passes through the reactance SW 30 and reaches the output interface 20. That is, the high-frequency switch 1 becomes the On-state.

Meanwhile, the right view of FIG. 2 illustrates that with the change in reactance of the second reactance circuit 33, the passband of the second reactance circuit 33 becomes the third frequency band ($f_5$ to $f_6$) that greatly deviates from the first frequency band ($f_1$ to $f_2$). Then, a high-frequency signal that has been input to the input interface 10 and passed through the first reactance circuit 31 is reflected by the second reactance circuit 33. Therefore, the high-frequency signal does not reach the output interface 20, and thus, the high-frequency switch 1 becomes the Off-state.

That is, the switch function of the high-frequency switch 1 of this embodiment can be implemented only by changing the magnitude of reactance. Therefore, the high-frequency switch 1 of this embodiment can be regarded as a reactance-type switch. A reactance-type switch has no resistance components in its portion serving a switch function. Therefore, even when such switches are connected in multiple stages, almost no loss resulting from resistance components will occur unlike in the conventional switches. Further, even in a case where there are resistance components, a high reflection state can be obtained by changing reactance. Therefore, the contribution of resistance to loss can be controlled. Furthermore, since the magnitude of reactance, in particular, the magnitude of capacitance changes instantaneously, the switch changes state at a high speed, which means that the switching speed is quite high. Therefore, such a switch is suitable for the high-speed switching of whether to pass or block a high-frequency signal in the submillimeter wave band or the millimeter wave band through a transmission path.

Meanwhile, when the high-frequency switch 1 is in the Off-state, a signal is not absorbed but is totally reflected. Therefore, the generation of noise resulting from heat generation can be eliminated unlike in the above described absorptive switch. Further, since elements other than the variable capacitance element can be implemented using conductive patterns, high reflection can be obtained by combining the inductive reactance of the conductive patterns and the capacitive inductance of the variable capacitance element. As a result, the influence of resistance as loss can be suppressed. Therefore, a high-frequency switch with high isolation can be easily realized.

Although the first embodiment illustrates a configuration in which the passband of the first reactance circuit 31 is set wider than that of the second reactance circuit 33 in the subsequent stage, the passbands may be set the same. Rather, when such circuits are connected in multiple stages, setting the passband of the circuit in the preceding stage to be narrower than that of the circuit in the subsequent stage may be able to reduce a change in the magnitude of the reactance of the circuit in the subsequent stage and thus increase the operating speed of the switch function.

In addition, though FIG. 2 illustrates an example in which the passband of the first reactance circuit 31 is fixed and the passband of second reactance circuit 33 is made variable, the relationship of the fixed passband and the variable passband may be reversed. Alternatively, both the passband of the first reactance circuit 31 and the passband of the second reactance circuit 33 may be variable.

Exemplary Reactance Circuit 1

Figure 3A:
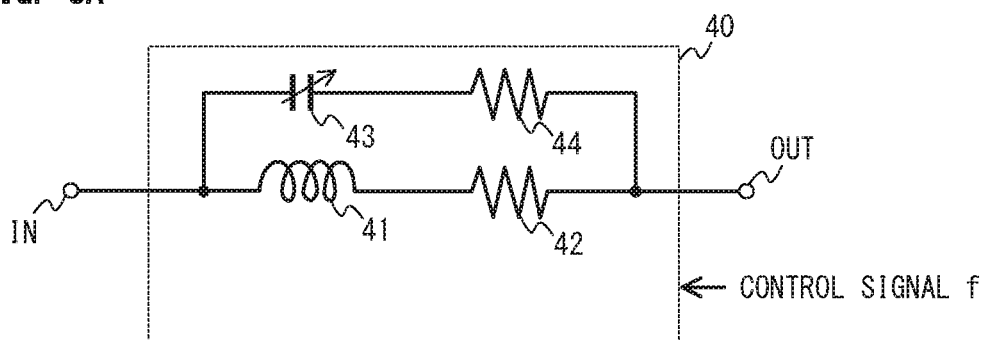
FIG. 3A is an exemplary diagram of a reactance circuit of a first example.

Next, examples of the first reactance circuit 31 and the second reactance circuit 33 will be described. FIG. 3A is an exemplary diagram of a reactance circuit 40 according to a first example. The reactance circuit 40 is configured, between an input terminal IN and an output terminal OUT, as a parallel resonance circuit of an induction element 41 and a variable capacitance element 43. Resistance components 42 and 44 are parasitic resistances 42 and 44 of the induction element 41 and the variable capacitance element 43, respectively, and their resistance values are negligible levels. The induction element 41 is a conductive pattern formed in various shapes on the surface of a substrate so as to generate an inductance of 0.15 nH. The variable capacitance element 43 is an element whose capacitance changes in the range of 0.05 to 0.2 pF. For example, a commercially available HEMT (with a gate width of about 200 µm) or a Schottky diode can be used for the variable capacitance element 43. Changes in the capacitance can be achieved by changing a voltage applied to the gate in the range of about +0.7 to −3 V using a control signal f input from the outside.

Hereinafter, an example in which the reactance circuit 40 exemplarily illustrated in FIG. 3A is used as each of the first reactance circuit 31 and the second reactance circuit 33 in FIG. 1 will be described. In this example, the passband of the first reactance circuit 31 is fixed and the passband of the second reactance circuit 33 is made variable, and exemplary characteristics of the circuits operated as in FIG. 2 will be described using S-parameters. The S-parameters are obtained by representing the current-voltage characteristics at the input and output of a distribution constant circuit as the relationship between incident waves, reflected waves, and passed waves, as is well known. Provided that each of the input interface 10 and the output interface 20 has a signal end at 50Ω and a grounding end at the ground potential, the S-parameters are represented by $S_{11}$, $S_{12}$, $S_{21}$, and $S_{22}$. The parameter $S_{11}$ represents the reflection coefficient of a high-frequency signal as seen from the side of the input interface 10. The parameter $S_{21}$ represents the transfer function in the forward direction as seen from the side of the input interface 10, that is, the pass-through coefficient of a high-frequency signal. The smaller the parameter $S_{21}$, the less easy it is for a high-frequency signal to pass. In addition, the greater the parameter $S_{11}$, the easier it is to obtain a state close to total reflection. The parameters $S_{12}$ and $S_{22}$ are the coefficients as seen from the side of the output interface 20.

Figure 3B:
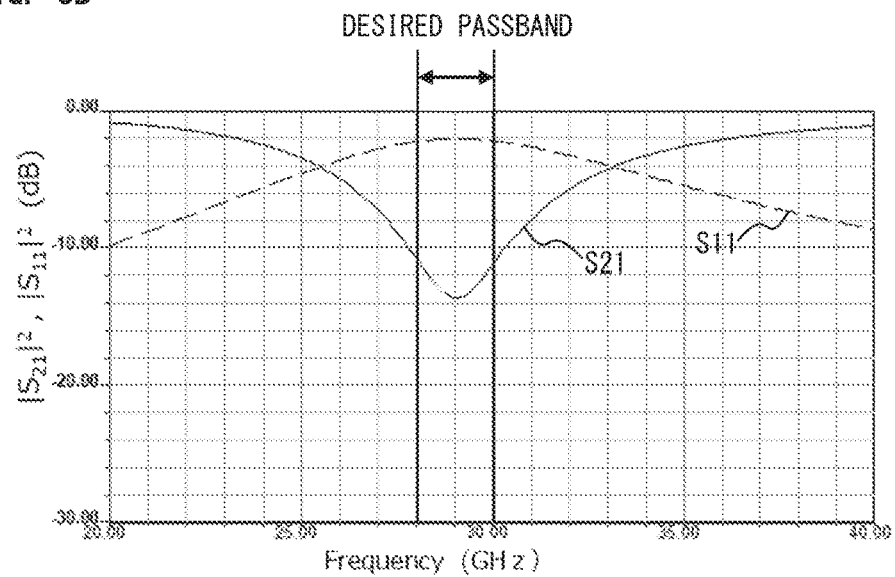
FIG. 3B is a characteristic diagram illustrating the Off-state of the high-frequency switch.
Figure 3C:
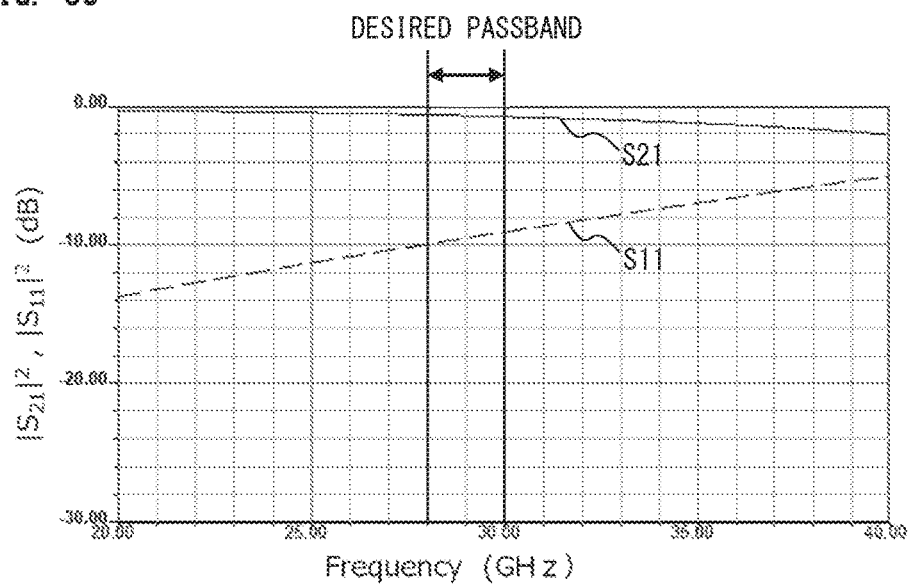
FIG. 3C is a characteristic diagram illustrating the On-state of the high-frequency switch.

FIG. 3B illustrates an example in which the capacitance of the variable capacitance element 43 is 0.2 pF, and FIG. 3C illustrates an example in which the capacitance of the variable capacitance element 43 is 0.05 pF. In each diagram, the abscissa axis indicates frequency (GHz) and the ordinate axis indicates the square (dB) of the absolute value of each of $S_{21}$ and $S_{11}$. As illustrated in FIG. 3B, when the capacitance of the variable capacitance element 43 is 0.2 pF, the pass-through coefficient $S_{21}$ (solid line) is the minimum and the reflection coefficient Sii (dashed line) is the maximum at a desired passband frequency of 29 GHz. Therefore, a high-frequency signal which has been input to the input interface 10 and passed through the first reactance circuit 31 is totally reflected by the second reactance circuit 33. That is, the high-frequency switch 1 becomes the Off-state.

In this embodiment, a state in which a high-frequency signal which has passed through the input interface 10 is substantially totally reflected toward the input interface 10 (for example, $S_{11}$ is large enough for the high-frequency signal to be substantially totally reflected) is described as a "total reflection state."

When the capacitance of the variable capacitance element 43 is 0.05 pF, as illustrated in FIG. 3C, the pass-through coefficient $S_{21}$ (solid line) is greater than the reflection coefficient $S_{11}$ (dashed line) at a desired passband frequency of 29 GHz. Therefore, a high-frequency signal input to the input interface 10 passes through the first reactance circuit 31 and the second reactance circuit 33 and then reaches the output interface 20. That is, the high-frequency switch 1 becomes the On-state.

Exemplary Reactance Circuit 2

Figure 4A:
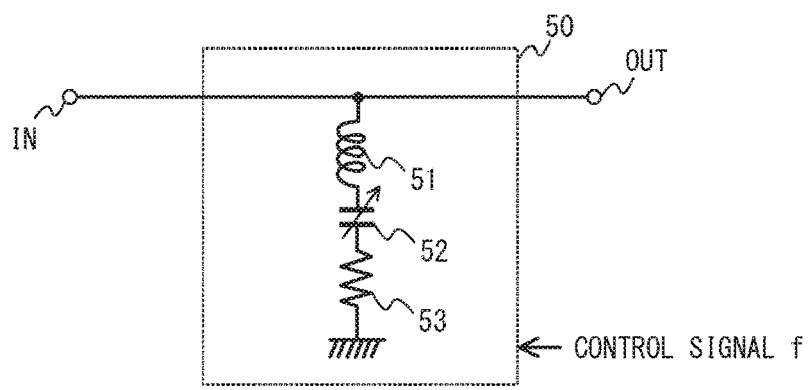
FIG. 4A is another exemplary diagram of a reactance circuit of a second example.

FIG. 4A is an exemplary diagram of a reactance circuit 50 of a second example. The reactance circuit 50 includes an induction element 51 connected to a transmission path pattern (i.e., an example of a conductive pattern) between an input terminal IN and an output terminal OUT, and a variable capacitance element 52 having one end connected in series with the other end of the induction element 51 and having the other end grounded (i.e., shunt-connected). Parasitic resistance 53 of a negligible level is present between the other end of the variable capacitance element 52 and a grounding terminal.

The induction element 51 is, for example, a conductive pattern formed on the surface of an insulating substrate so as to generate an inductance of 0.15 nH as in the first example. The capacitance of the variable capacitance element 52 changes in the range of 0.05 to 0.2 pF in accordance with a control signal f input from the outside. When an HEMT is used as the variable capacitance element 52, the parasitic resistance 53 in the 29 GHz band is at about 2 to 20Ω. However, when the switch is in the On-state, the reactance of the series circuit of the induction element 51 and the variable capacitance element 52, which is an HEMT, ideally becomes infinitely high impedance. Thus, the magnitude of the resistance can be ignored.

Figure 4B:
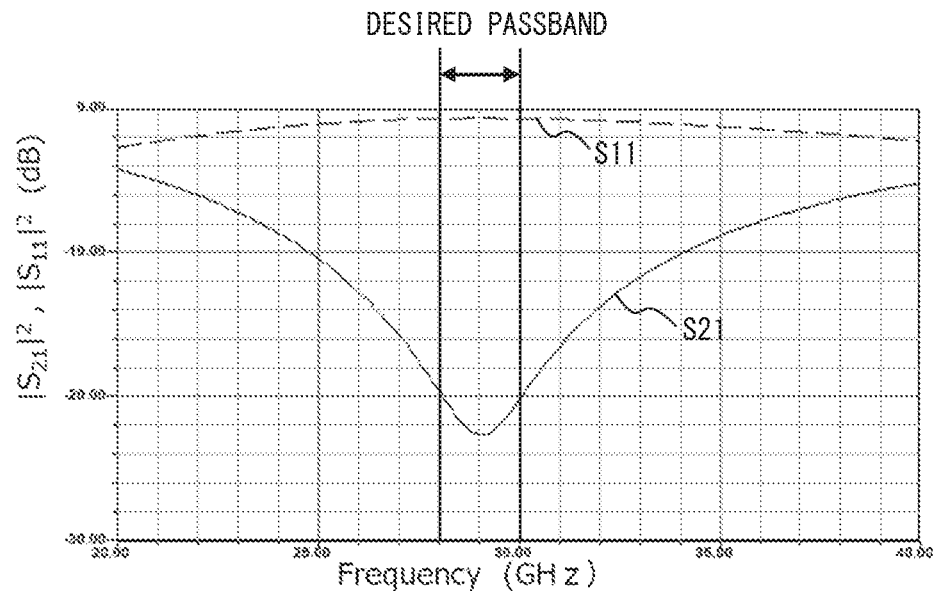
FIG. 4B is a characteristic diagram illustrating the Off-state of the high-frequency switch.
Figure 4C:
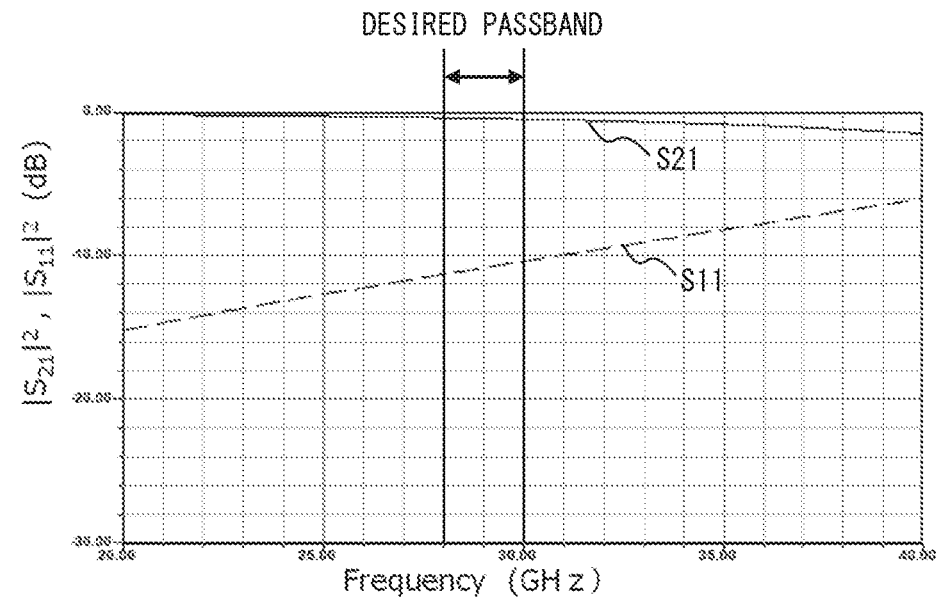
FIG. 4C is a characteristic diagram illustrating the On-state of the high-frequency switch.

Hereinafter, an example in which the reactance circuit 50 exemplarily illustrated in FIG. 4A is used as each of the first reactance circuit 31 and the second reactance circuit 33 in FIG. 1 will be described. In this example, the passband of the first reactance circuit 31 is fixed and the passband of the second reactance circuit 33 is made variable, and exemplary characteristics of the circuits operated as in FIG. 2 are illustrated in FIGS. 4B and 4C. FIG. 4B illustrates an example in which the capacitance of the variable capacitance element 52 is 0.2 pF, and FIG. 4C illustrates an example in which the capacitance of the variable capacitance element 52 is 0.05 pF. In each diagram, the abscissa axis indicates frequency (GHz) and the ordinate axis indicates the square (dB) of the absolute value of each of $S_{21}$ and $S_{11}$.

As illustrated in FIG. 4B, when the capacitance of the variable capacitance element 52 is 0.2 pF, the pass-through coefficient $S_{21}$ (solid line) is the minimum and the reflection coefficient $S_{11}$ (dashed line) is the maximum at a desired passband frequency of 29 GHz. Therefore, a high-frequency signal which has been input to the input interface 10 and passed through the first reactance circuit 31 is totally reflected by the second reactance circuit 33. That is, the high-frequency switch 1 becomes the Off-state.

Meanwhile, when the capacitance of the variable capacitance element 52 is 0.05 pF as illustrated in FIG. 4C, the pass-through coefficient $S_{21}$ (solid line) is greater than the reflection coefficient $S_{11}$ (dashed line) at a desired passband frequency of 29 GHz. Therefore, a high-frequency signal input to the input interface 10 passes through the first reactance circuit 31 and the second reactance circuit 33 and then reaches the output interface 20. That is, the high-frequency switch 1 becomes the On-state.

Exemplary Reactance Circuit 3

Figure 5:
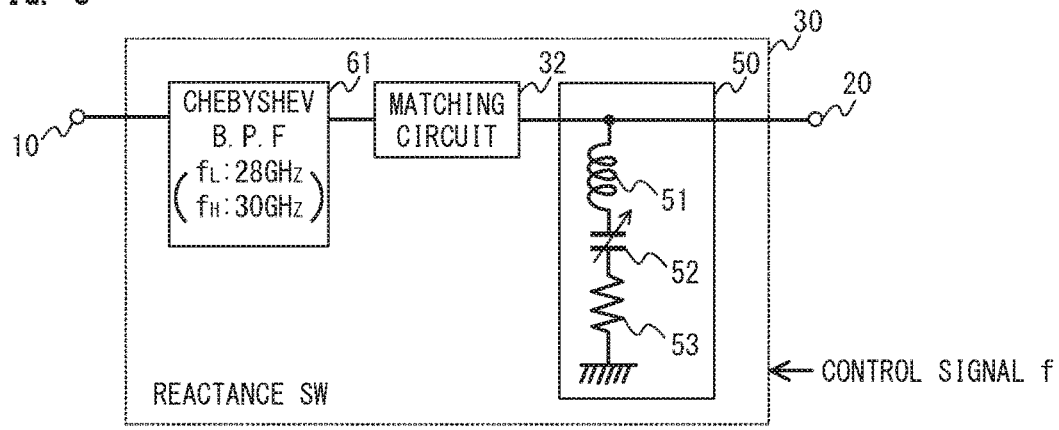
FIG. 5 is a configuration diagram of a high-frequency switch with a reactance circuit of the second example.

The first and second examples each illustrate a case where the passband of one of the two reactance circuits with the same configuration is fixed and the passband of the other reactance circuit is made variable. However, the configurations of the two reactance circuits need not be the same. FIG. 5 illustrates an example of the reactance SW 30 in which a third-order Chebyshev B.P.F (bandpass filter) 61 is used as an example of the first reactance circuit 31 in FIG. 1, and the reactance circuit 50 of the second example is used as an example of the second reactance circuit 33. The matching circuit 32 is similar to that illustrated in FIG. 1. The Chebyshev B.P.F 61 is a bandpass filter having less ripples than the filter in the subsequent stage, and is a special filter used to stably remove noise outside of a desired passband. The reactance circuit 50 changes in reactance in accordance with a control signal f input from the outside, thereby changing a high-frequency signal in the desired passband as illustrated in FIG. 2.

Figure 6A:
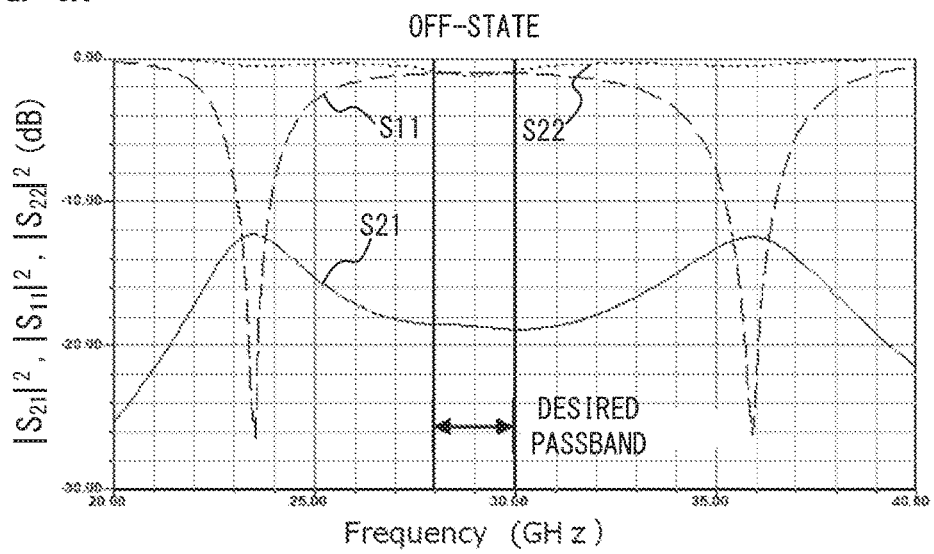
FIG. 6A illustrates exemplary switching characteristics of the high-frequency switch illustrated in FIG. 5.
Figure 6B:
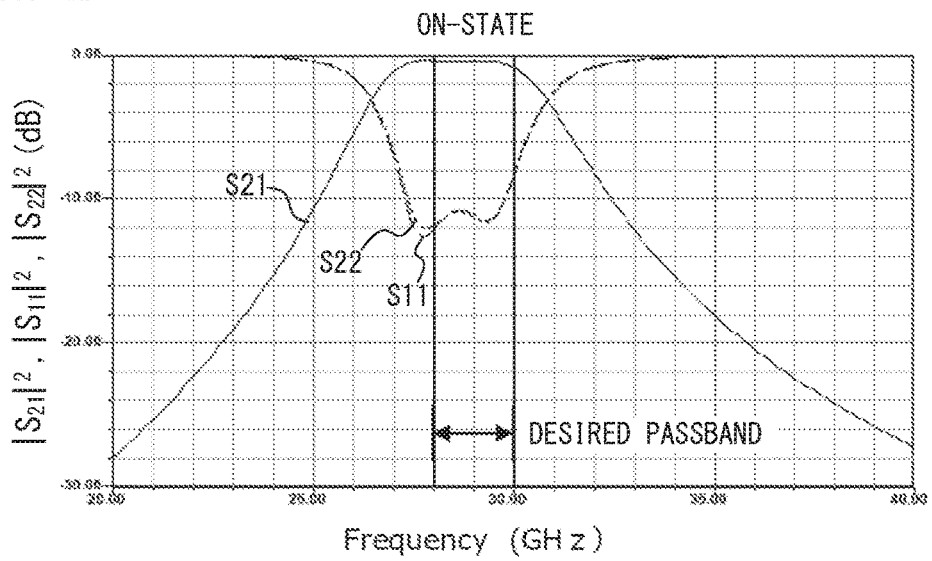
FIG. 6B illustrates exemplary switching characteristics of the high-frequency switch illustrated in FIG. 5.

FIGS. 6A and 6B illustrate exemplary characteristics of the high-frequency switch according to the configuration example of Figure. 5; specifically, FIG. 6A illustrates an example of the switch in the Off-state and FIG. 6B illustrates an example of the switch in the On-state. In each diagram, the abscissa axis indicates frequency (GHz) and the ordinate axis indicates the square (dB) of the absolute value of each of $S_{21}$ and $S_{11}$. FIG. 6A illustrates an example in which the capacitance of the variable capacitance element 52 is 0.2 pF, and FIG. 6B illustrates an example in which the capacitance of the variable capacitance element 52 is 0.05 pF. The reflection coefficient $S_{22}$ is omitted as it has the same dimension as the reflection coefficient $S_{11}$.

As illustrated in FIG. 6A, when the capacitance of the variable capacitance element 52 is 0.2 pF, the pass-through coefficient $S_{21}$ (solid line) is smaller than the reflection coefficients $S_{11}$ (long dashed line) and $S_{22}$ (short dashed line) at a desired passband frequency of 29 GHz. Therefore, a high-frequency signal input to the input interface 10 is reflected almost entirely. That is, the high-frequency switch becomes the Off-state.

Meanwhile, when the capacitance of the variable capacitance element 52 is 0.05 pF as illustrated in FIG. 6B, the pass-through coefficient $S_{21}$ (solid line) is the maximum and is greater than the reflection coefficients $S_{11}$ (the long dashed line) and $S_{22}$ (short dashed line) at a desired passband frequency of 29 GHz. Therefore, a high-frequency signal input to the input interface 10 reaches the output interface 20. That is, the high-frequency switch becomes the On-state. Pass-through loss in the On-state is about equal to the insertion loss of the Chebyshev B.P.F 61 (+1 dB or less), which is almost a negligible level.

Since the Chebyshev B.P.F (bandpass filter) 61 can stably remove noise outside of the desired passband, it can implement a high-frequency switch adapted to be suitably mounted immediately below an antenna. There is another advantage in that since the Chebyshev B.P.F 61 is a conductive pattern without side coupling, it is relatively easy to produce. However, instead of the Chebyshev B.P.F 61, other types of filters having less ripples than the second reactance circuit 50 in the subsequent stage may also be used.

Second Embodiment

The high-frequency switch 1 of the first embodiment is an example in which the switch is suited to be operated as an SPST (Single Pole, Single Throw) switch. However, the high-frequency switch of the present invention may also be implemented as an SPnT switch (n is a natural number more than or equal to 2).

Figure 7:
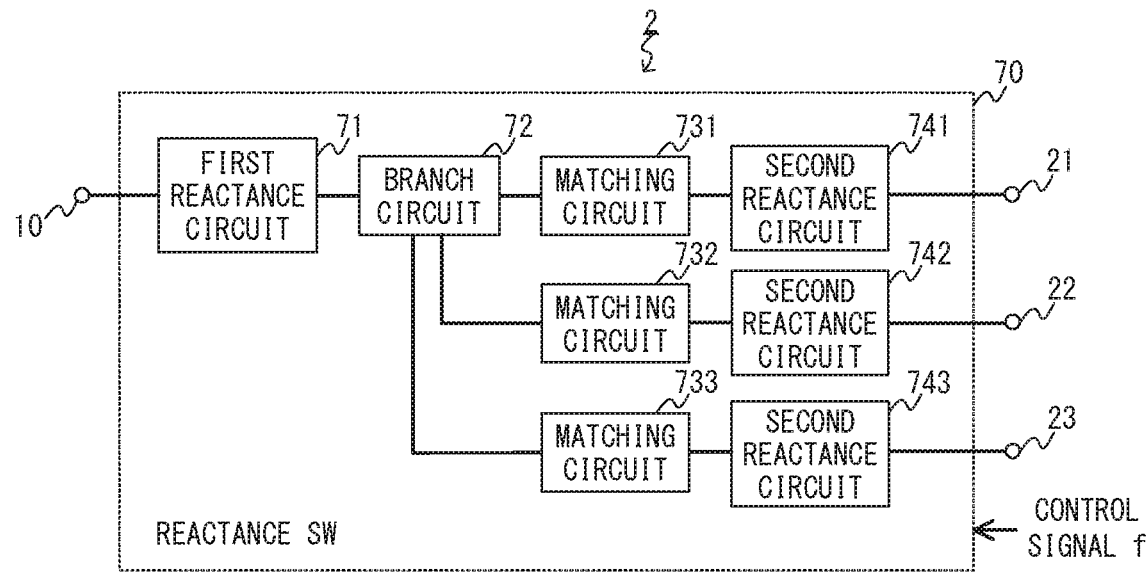
FIG. 7 is a configuration diagram of a high-frequency switch according to a second embodiment.

FIG. 7 is a configuration diagram of a high-frequency switch 2 according to a second embodiment. The high-frequency switch 2 includes one input interface 10, a reactance SW 70, and three (three sets of) output interfaces 21, 22, and 23.

The reactance SW 70 includes a first reactance circuit 71 connected to the input interface 10; a branch circuit 72 which branches a high-frequency signal having passed through the first reactance circuit 71 into three transmission paths; and matching circuits 731, 732, and 733 and second reactance circuits 741, 742, and 743 provided between the branched transmission paths and the output interfaces 21, 22, and 23, respectively. These circuits can be embodied with conductive patterns formed on an insulating substrate and passive elements which serve switch functions.

Hereinafter, the input interface 10, the output interface 21, the output interface 22, and the output interface 23 shall be referred to as ports 1, 2, 3, and 4, respectively, for convenience's sake. Described below is a case where a path from the port 1 to the port 2 is in the On-state, and a path from the port 1 to the port 3 as well as a path from the port 1 to the port 4 is in the Off-state.

The branch circuit 72 may simply be three branch lines branched from a single transmission path pattern as an example of a conductive pattern. In such a case, the length of the pattern from the branch point to each of the second reactance circuits 741, 742, and 743 is set equal. When the reactances of the matching circuits 731, 732, and 733 are adjusted to bring the second reactance circuits 741, 742, and 743 into the Off-state, respectively, the absolute values of the impedances of the second reactance circuits 741, 742, and 743 as seen from the branch point of the branch circuit 72 become the maximum. That is, the switch is designed to obtain the maximum reflection. This can minimize the signals entering the ports in the Off-state. For example, when the reactance circuit 50 illustrated in FIG. 4A (i.e., the reactance circuit of the second example) is used as each of the second reactance circuits 741, 742, and 743, each reactance circuit has a reactance of 0Ω in the Off-state due to the series resonance of the induction element 51 and the variable capacitance element 52, and thus has low impedance. In addition, when a transmission line with an electrical length of ¼ wavelength at a desired frequency is used as each matching circuit, impedance inclusive of the branch point to each reactance circuit including a variable capacitance element can be maximized. In the On-state, reactance becomes high. Thus, the characteristics of the matching circuits have no influence on loss.

Accordingly, a circumstance where a high-frequency signal which has been reflected by any one of the branch lines enters the other branch lines can be avoided. Each of the matching circuits 731, 732, and 733 is a conductive pattern with not only the aforementioned function of adjusting reactance but also a function of converting impedance by finely adjusting the length of the pattern among the branch lines.

For the first reactance circuit 71, the Chebyshev B.P.F (bandpass filter) 61 can be used. For each of the second reactance circuits 741, 742, and 743, the reactance circuit 40 illustrated in FIG. 3A or the reactance circuit 50 illustrated in FIG. 4A can be used. That is, the reactance of each of the second reactance circuits 741, 742, and 743 on each branch line is changed independently with a control signal f input from the outside. Accordingly, the switching characteristics on each branch line can be switched as in FIGS. 3B and 3C or as in FIGS. 4B and 4C. In addition, varying the timing of turning On each branch line with a control signal f among the branch lines can avoid the possibility of a high-frequency signal entering an unintended branch line among the branch lines.

Figure 8:
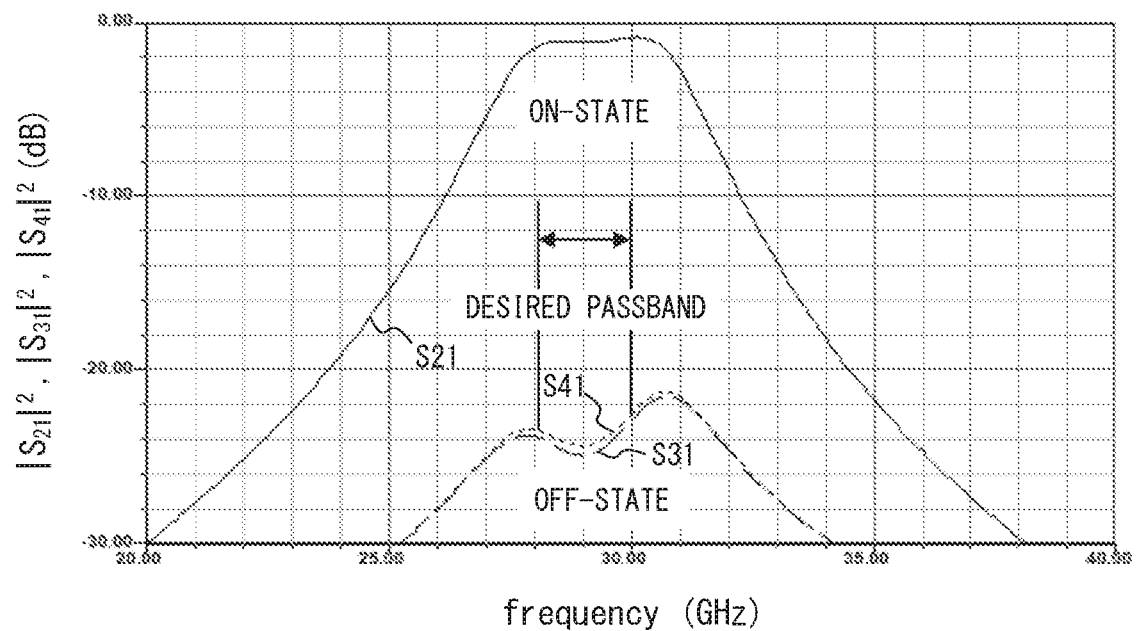
FIG. 8 illustrates exemplary switching characteristics of the high-frequency switch according to the second embodiment.

FIG. 8 illustrates exemplary switching characteristics of the second embodiment, where the reactance circuit 50 illustrated in FIG. 4A (i.e., the reactance circuit of the second example) is used as each of the second reactance circuits 741, 742, and 743. FIG. 8 illustrates exemplary switching characteristics of the second and third branch lines when the first branch line is in the On-state. The ordinate axis and the abscissa axis are similar to those in FIGS. 3B and 3C, and the like. In FIG. 8, the solid line represents the pass-through coefficient $S_{21}$ of the first branch line, the long dashed line represents the pass-through coefficient $S_{31}$ of the second branch line, and the short dashed line represents the pass-through coefficient $S_{41}$ of the third branch line. The reflection coefficients $S_{31}$ (i.e., the reflection coefficient as seen from the output terminal 23 as the port 3: its dimension is similar to those of the other S-parameters) and $S_{41}$ (i.e., the reflection coefficient as seen from the output terminal 23 as the port 4: its dimension is similar to those of the other S-parameters) of the second and third branch lines, respectively, in the Off-state can be set lower than the pass-through coefficient $S_{21}$ of the first branch line in the On-state by 22 dB or more. Thus, the influence of reflected waves from the second and third branch lines on the first branch line can be suppressed.

As described above, the high-frequency switch 2 of the second embodiment can also switch On/Off of a high-frequency signal only by varying reactance while fixing resistance components. Thus, effects similar to those of the first embodiment can be achieved. In addition, as the first reactance circuit 71 is shared, noise outside of a desired passband can be stably removed. Further, the three branch lines are selectively and independently switched between the On-state and the Off-state, and in comparison with the input end of the second reactance circuit on any one of the branch lines, the input ends of the second reactance circuits on the other branch lines have higher impedance. Thus, an increase in power loss of the branch line in the On-state can be suppressed. Therefore, for example, a plurality of antennae, such as an antenna which performs only transmission, an antenna which performs only reception, and an antenna capable of both transmission and reception, can be operated independently using a single high-frequency switch 2.

Although the second embodiment illustrates an example in which three branch lines are provided, two branch lines, or four or more branch lines may be provided.

Third Embodiment

Although the second embodiment illustrates an example in which one input interface and a plurality of output interfaces are provided, it is also possible to provide a plurality of input interfaces and one output interface. A third embodiment will describe an example of such a high-frequency switch.

Figure 9:
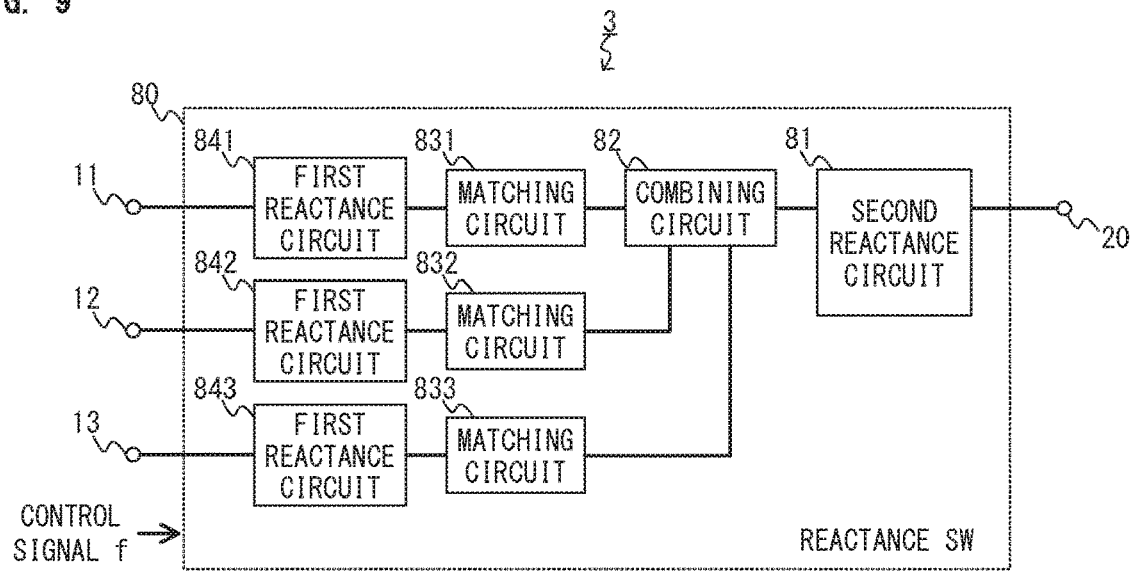
FIG. 9 is a configuration diagram of a high-frequency switch according to a third embodiment.

FIG. 9 is a configuration diagram of a high-frequency switch according to the third embodiment. A high-frequency switch 3 of the third embodiment is obtained by reversing the input-output relationship of the high-frequency switch 2 of the second embodiment illustrated in FIG. 7 and using the branch circuit 72 of the reactance SW 70 of the second embodiment as a combining circuit 82. That is, the high-frequency switch 3 includes three input interfaces 11, 12, and 13. These correspond to the output interfaces 21, 22, and 23 of the high-frequency switch 2 of the second embodiment. In addition, the high-frequency switch 3 includes an output interface 20. This corresponds to the input interface 10 of the high-frequency switch 2 of the second embodiment.

A reactance SW 80 of the high-frequency switch 3 of the third embodiment includes three first reactance circuits 841, 842, and 843, matching circuits 831, 832, and 833, the combining circuit 82 (which corresponds to the branch circuit 72 in FIG. 7), and a second reactance circuit 81. The configuration and operation of each circuit are similar to those described in the second embodiment, and only the input-output relationship is opposite. The number of branch lines may be changed as in the second embodiment.

The high-frequency switch 3 of the third embodiment can be implemented as an nPST (nPole, Single Throw) switch. Therefore, when a plurality of types of antennae are shared by a single wireless communication device, for example, the high-frequency switch 2 of the second embodiment and the high-frequency switch 3 of the third embodiment can be used independently as a high-frequency transmitting switch and a high-frequency receiving switch, respectively. Alternatively, when the desired passband is 29 GHz, since insulating substrates for mounting are each about 10 mm square in size, it is possible to accommodate the high-frequency switches 2 and 3 in a single package housing one or two substrates. In such a case, only one input terminal is needed to receive a control signal f from the outside. Therefore, there is an advantage that a high-frequency switch can be provided that is simpler in configuration and compact and can be used for many applications.

The high-frequency switch of the present invention can be implemented as not only an SPnT switch or an nPST switch, but also an mPnT switch (m is a natural number more than or equal to 2). Further, the high-frequency switch can also be implemented as a matrix switch which is obtained by connecting SPST switches, SPnT switches, or mPnT switches in a cascade arrangement. Matrix switches supposed herein include a node-switch type and a path-switch type. For high-frequency applications, a matrix switch of a path-switch type is desirably used considering the ease of impedance matching and isolation.

Fourth Embodiment

Figure 10:
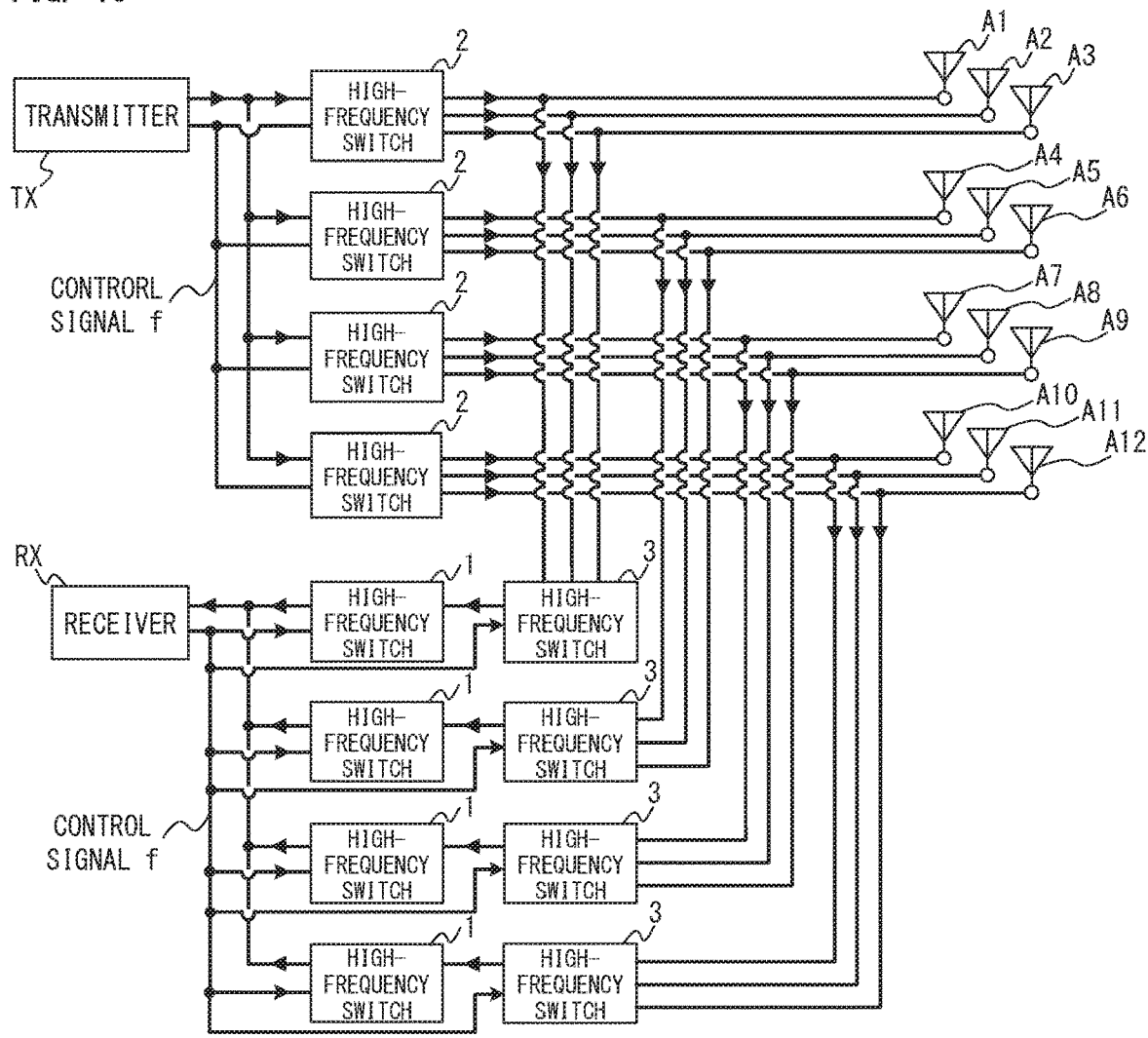
FIG. 10 is a configuration diagram of an antenna device according to a fourth embodiment.

A fourth embodiment will describe an exemplary embodiment of an antenna device having mounted thereon the high-frequency switches of the present invention. FIG. 10 is a configuration diagram of an antenna device according to the fourth embodiment. The antenna device includes 12 antennae A1 to A12 disposed at equal distances (i.e., at intervals of 30 degrees) so as to cover all directions (360 degrees); and a transmitting circuit and a receiving circuit which share the antennae A1 to A12, all of which are accommodated in an antenna case which is permeable to radio waves.

The antennae A1 to A12 are high-directivity horn antennae each capable of transmitting and receiving high-frequency signals in the 29 GHz band, and are disposed such that four sets of antenna sectors each including three antennae are arranged equidistantly in the horizontal direction at intervals of 30 degrees with respect to the direction of the central axis of directivity. Accordingly, the antennae A1 to A12 are disposed so as to be able to cover all directions (360 degrees) in the horizontal direction.

The transmitting circuit includes four high-frequency switches 2 (each corresponding to the high-frequency switch 2 of the second embodiment) for selectively switching a transmission signal, which has been transmitted from a transmitter TX, and supplying (feeding) it to one of the antennae A1 to A12.

The receiving circuit includes four high-frequency switches 1 (each corresponding to the high-frequency switch 1 of the first embodiment). Using the high-frequency switches 1 can switch whether to use the antennae A1 to A12 as transmitting antennae or receiving antennae, together with the four high-frequency switches 3 (each corresponding to the high-frequency switch 3 of the third embodiment) for selectively switching signals received from the antennae A1 to A12 and inputting the signals to the receiver RX.

Each of the high-frequency switches 1 and the high-frequency switches 3 has no active elements in its portion implementing the switch function. Thus, the switch function can be implemented only by passive elements, and maximizing reactance can suppress leakage of signals to the output terminal in the Off-state. Thus, even when the high-frequency switches 1 and the high-frequency switches 3 are connected in parallel, only small insertion loss occurs. The same is true of the high-frequency switches 2. Therefore, any of the antennae A1 to A12 in a desired direction can be selected with low loss at the time of transmission and reception. Accordingly, full-duplex communication is possible. In addition, the antennae can also be configured as an MIMO (multiple-input and multiple-output) antenna. The antennae A1 to A12 may also be disposed such that antennae for horizontal polarization and those for vertical polarization are alternately arranged.

Modified Example

The first to fourth embodiments illustrate the examples in which the desired passband is the 29 GHz band. However, the desired passband may be other frequency bands. For example, the high-frequency switch or the antenna device of the present invention may also be implemented in other frequency bands, such as a 30 GHz band or greater, a 5 GHz band, a 2.5 GHz band, or the microwave band.

The invention claimed is:

1. A high-frequency switch comprising:
an input interface configured to receive a high-frequency signal;
an output interface configured to output the high-frequency signal to outside; and
a reactance switch inserted between the input interface and the output interface,
wherein the reactance switch includes a plurality of reactance circuits connected in a cascade arrangement between the input interface and the output interface,
wherein each of the plurality of reactance circuits is configured to form a common passband for the high-frequency signal based on a reactance of a respective predetermined values,
wherein at least one of the reactance circuits is a variable reactance circuit having a reactance which changes in response to a control signal input from the outside so that the passband of the variable reactance circuit changes,
wherein, when the passband of the variable reactance circuit in the reactance switch changes in response to the control signal, a first state or a second state is selectively formed, the first state being a state in which the high-frequency signal input to the input interface is guided to the output interface, the second state being a state in which the high-frequency signal is reflected, and
wherein the second state is a total reflection state in which the high-frequency signal having passed through the input interface is totally reflected toward the input interface.

2. The high-frequency switch according to claim 1, wherein a passband formed by a reactance circuit in a preceding stage of the plurality of reactance circuits is narrower than a passband of a reactance circuit in a subsequent stage.

3. The high-frequency switch according to claim 1, wherein the variable reactance circuit includes a combination of a capacitive reactance element and an inductive reactance element.

4. The high-frequency switch according to claim 1, wherein the capacitive reactance element and the inductive reactance element operate as passive elements.

5. The high-frequency switch according to claim 1,
wherein the plurality of reactance circuits include a first reactance circuit and a second reactance circuit in a subsequent stage of the first reactance circuit, the first reactance circuit and the second reactance circuit being connected in a cascade arrangement between the input interface and the output interface, wherein the first reactance circuit is a bandpass filter, and wherein the second reactance circuit is one of a bandpass filter, a high-pass filter, a low-pass filter, and a band-rejection filter.

6. The high-frequency switch according to claim 1, further comprising an insulating substrate, wherein circuit components other than the variable reactance circuit of the reactance switch are formed by a conductive pattern formed on the substrate.

7. The high-frequency switch according to claim 6, wherein the variable reactance circuit includes a variable capacitance element mounted on a conductive pattern formed on the substrate.

8. The high-frequency switch according to claim 1, wherein the high-frequency signal is a signal in a millimeter wave band.

9. A high-frequency switch comprising:
an input interface configured to receive a high-frequency signal;
an output interface configured to output the high-frequency signal to outside; and
a reactance switch inserted between the input interface and the output interface,
wherein the reactance switch includes a variable reactance circuit for which a first state or a second state is selectively formed when a reactance of the variable reactance circuit changes in response to a control signal input from the outside, the first state being a state in which the high-frequency signal is guided to the output interface, the second state being a state in which the high-frequency signal is reflected
wherein the second state is a total reflection state in which the high-frequency signal having passed through the input interface is totally reflected toward the input interface.

10. A high-frequency switch comprising:
an input interface configured to receive a high-frequency signal;
a branch circuit configured to branch the received high-frequency signal into n lines (where n is a natural number more than or equal to 2);
n output interfaces provided corresponding to the n respective lines, the n output interfaces each configured to output the high-frequency signals of the respective lines to outside; and
a reactance switch inserted between the branch circuit and each of the n output interfaces,
wherein the reactance switch includes a plurality of reactance circuits connected in a cascade arrangement between an input side and an output side of each line, wherein each of the plurality of reactance circuits is configured to form a common passband for the high-frequency signal on the input side based on a reactance of a respective predetermined values,
wherein at least one of the reactance circuits is a variable reactance circuit having a reactance which changes in response to a control signal input from the outside so that the passband of the variable reactance circuit changes,
wherein, when the passband of the variable reactance circuit in the reactance switch changes in response to the control signal, a first state or a second state is selectively formed, the first state being a state in which the high-frequency signal input to the input interface is guided to the output interface, the second state being a state in which the high-frequency signal is reflected, and wherein the second state is a total reflection state in which the high-frequency signal having passed through the input interface is totally reflected toward the input interface.

11. A high-frequency switch comprising:
n input interfaces (where n is a natural number more than or equal to 2) which respectively receive high-frequency signals from independent lines;
a combining circuit which combines the received high-frequency signals of n lines into a high-frequency signal for one line;
an output interface configured to output the high-frequency signal resulting from the combining to outside; and
a reactance switch inserted between each of the n input interfaces and the combining circuit,
wherein the reactance switch includes a plurality of reactance circuits connected in a cascade arrangement between an input side and an output side of each line, wherein each of the plurality of reactance circuits is configured to form a common passband for the high-frequency signal on the input side based on a reactance of a respective predetermined values,
wherein at least one of the reactance circuits is a variable reactance circuit having a reactance which changes in response to a control signal input from the outside so that the passband of the variable reactance circuit changes,
wherein, when the passband of the variable reactance circuit in the reactance switch changes in response to the control signal, a first state or a second state is selectively formed, the first state being a state in which the high-frequency signal input to the input interface is guided to the output interface, the second state being a state in which the high-frequency signal is reflected, and
wherein the second state is a total reflection state in which the high-frequency signal having passed through the input interface is totally reflected toward the input interface.

12. An antenna device comprising:
an antenna case configured to be permeable to radio waves;
an antennae accommodated in the antenna case and having different directivities;
a transmitting circuit and a receiving circuit that share the n antennae,
wherein the transmitting circuit includes a high-frequency switch, comprising:
an input interface configured to receive a high-frequency signal;
a branch circuit configured to branch the received high-frequency signal into n lines (where n is a natural number more than or equal to 2);
n output interfaces provided corresponding to the n respective lines, the n output interfaces each configured to output the high-frequency signals of the respective lines to outside; and
a reactance switch inserted between the branch circuit and each of the n output interfaces,
wherein the reactance switch includes a plurality of reactance circuits connected in a cascade arrangement between an input side and an output side of each line, wherein each of the plurality of reactance circuits is configured to form a common passband for the high-frequency signal on the input side based on a reactance of a respective predetermined values, and wherein at least one of the reactance circuits is a variable reactance circuit having a reactance which changes in response to a control signal input from the outside so that the passband of the variable reactance circuit changes, wherein the receiving circuit includes a high-frequency switch, comprising:
- n input interfaces (where n is a natural number more than or equal to 2) which respectively receive high-frequency signals from independent lines;
- a combining circuit which combines the received high-frequency signals of n lines into a high-frequency signal for one line;
- an output interface configured to output the high-frequency signal resulting from the combining to outside; and
- a reactance switch inserted between each of the n input interfaces and the combining circuit,
- wherein the reactance switch includes a plurality of reactance circuits connected in a cascade arrangement between an input side and an output side of each line, wherein each of the plurality of reactance circuits is configured to form a common passband for the high-frequency signal on the input side based on a reactance of a respective predetermined values, and
- wherein at least one of the reactance circuits is a variable reactance circuit having a reactance which changes in response to a control signal input from the outside so that the passband of the variable reactance circuit changes, and wherein a further high-frequency switch is disposed between the transmitting circuit and the receiving circuit, and the further high-frequency switch, comprises:
- an input interface configured to receive a high-frequency signal;
- an output interface configured to output the high-frequency signal to outside; and
- a reactance switch inserted between the input interface and the output interface,
- wherein the reactance switch includes a plurality of reactance circuits connected in a cascade arrangement between the input interface and the output interface, wherein each of the plurality of reactance circuits is configured to form a common passband for the high-frequency signal based on a reactance of a respective predetermined values, and
- wherein at least one of the reactance circuits is a variable reactance circuit having a reactance which changes in response to a control signal input from the outside so that the passband of the variable reactance circuit changes.

* * * * *